United States Patent [19]

Baum

[11] Patent Number: 4,600,847

[45] Date of Patent: Jul. 15, 1986

[54] PREDISTORTION EQUALIZING CIRCUIT

[75] Inventor: Peter N. Baum, Bedford, Mass.

[73] Assignee: GTE Laboratories Incorporated, Waltham, Mass.

[21] Appl. No.: 685,829

[22] Filed: Dec. 24, 1984

[51] Int. Cl.[4] .............................................. H03F 1/32
[52] U.S. Cl. ..................................... 307/491; 307/493; 307/311; 307/555; 307/499
[58] Field of Search ............... 307/491, 493, 311, 297, 307/555, 499

[56] References Cited

U.S. PATENT DOCUMENTS 3,465,168  9/1969  Luhowy et al. ................... 307/491
4,039,981  8/1977  Ohashi et al. ..................... 307/493
4,172,221 10/1979  Iizuka ................................. 307/311
4,380,711  4/1983  Cunningham ..................... 307/491
4,479,066 10/1984  Embree ............................. 307/493
4,520,282  5/1985  Watanabe et al. ................ 307/491

Primary Examiner—John S. Heyman
Attorney, Agent, or Firm—Fred Fisher

[57] ABSTRACT

A predistortion circuit that cancels second order distortion of light emitting diodes enabling interference free transmission of multiple vestigial sideband television channels through a single optical fiber. This is achieved by preamplifying a signal with an amplifier that has opposite characteristics to the distortions of a light emitting diode.

4 Claims, 4 Drawing Figures

PREDISTORTION EQUALIZING CIRCUIT

BACKGROUND OF THE INVENTION

1. Field of the Invention

This invention relates to a predistortion equalizing circuit for cancellation of second order distortion caused by a serially connected light emitting diode. Accordingly, it is a general object of this invention to provide new and improved circuits of such character.

2. Description of the Prior Art

A light emitting diode, typically, tends to distort an incoming signal applied thereto. That is, an output optical signal from the light emitting diode is not a linear representation of the electrical signal applied thereto.

In the past, others have endeavored to create a circuit that would linearize a light emitting diode to reduce interfering distortion of an analog signal applied thereto. Predistortion, feed forward, and optical feedback circuits have been used to linearize the outputs of light emitting diodes. Predistortion, as used in the past, utilized diode breakpoints to create an opposite transfer characteristic, though it cancelled the non-linearity of a light emitting diode characteristic curve. Feed forward utilizes two identical light emitting diodes in which the applied signal is split in two: one signal driving one light emitting diode to create a non-linearity which is then detected and subtracted from the drive signal to the second light emitting diode to cancel the non-linearity of the second. Optical feedback takes a sample of the light output from the light emitting diode, detects it, and subtracts it from the incoming signal, very much like a standard feedback amplifier, thus linearizing the light emitting diode.

These techniques of the prior art have not been very successful. Disadvantageously, the prior art predistortion circuits required large voltage swings and many adjustable breakpoints to create the correct predistortion. Large voltage swings required high impedances which were frequency limited by circuit capacitance. Adjustments of the breakpoints were quite tedious when the distortion components required reduction to 50 to 60 dB below the input signal.

Feed forward required an additional optical receiver as well as an identical light emitting diode. Any subtle differences between the light emitting diodes and the driver circuits hindered cancellation of the nonlinearity and could create new forms of distortion.

Optical feedback was limited by phase lag and time delay through the driver and feedback loop. That, in turn, limited the practical use of such a technique to below the required bandwidth for multi-channel service (10 MHz). The expense of an additional receiver and optical tap was also a drawback.

SUMMARY OF THE INVENTION

Another object of this invention is to provide a new and improved predistortion equalizer that utilizes the similarity of a semiconductor diode V-I characteristic and the optical power/current characteristic of a light emitting diode.

Still another object of this invention is to provide a new and improved predistortion equalizer which utilizes the similarity of a semiconductor diode V-I characteristic and the optical power/current characteristic of a light emitting diode wherein both curves have more radical curvature at low current and less curvature (more linearity) at high current.

Yet another object of this invention is to provide a new and improved predistortion equalizer that can be easily operated and economically coupled to linearize a light emitting diode through the adjustment of two controls at a low cost and relatively simple circuitry.

In accordance with one aspect of the invention, a predistortion equalizing circuit for cancellation of second order distortion that is caused by a serially connected light emitting diode includes a pair of complementary transistors. Each transistor has a collector, a base, and an emitter. Means are provided for coupling an input signal to the bases of the two transistors. First impedance means couple the collector of the NPN transistor to a source of positive potential. Second impedance means couple the collector of the PNP transistor to a source of negative potential. Third impedance means couple the emitter of the NPN transistor to a source of negative potential, and fourth impedance means couple the emitter of the PNP transistor to a source of positive potential. Means are provided for coupling the collectors to the light emitting diode. Emitter resistance means for the equalizing circuit include a serially connected first variable resistance and semiconductor diode coupled as a dynamic emitter load resistance across the emitters and a point of reference potential. A second variable resistance couples one electrode of the semiconductor diode to a voltage source of such polarity as to cause current to flow through such semiconductor diode.

In accordance with certain features of the invention, the second variable resistance can be adjusted to obtain a desired amount of nonlinearity about a current/voltage characteristic of the semiconductor diode. The first variable resistance can be adjusted to add linearity to this characteristic such that the combined effect matches and thus cancels the nonlinearity of a current/power characteristic of the light emitting diode.

BRIEF DESCRIPTION OF THE DRAWINGS

Other objects, advantages and features of this invention, together with its construction and mode of operation, will become more apparent from the following description, when read in conjunction with the accompanying drawings, in which.

GENERAL DESCRIPTION

Figure 1:
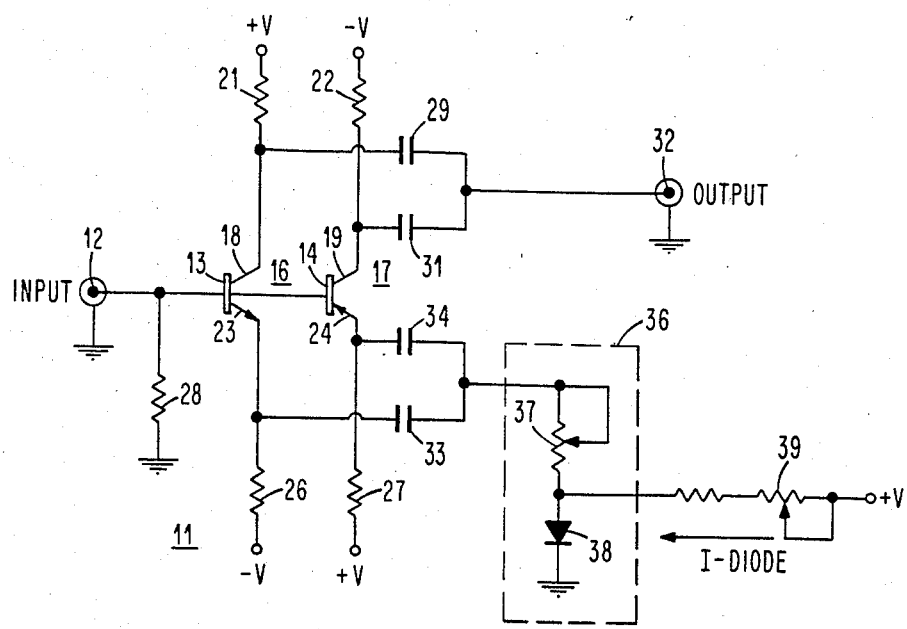
FIG. 1 is a circuit diagram of one embodiment of this invention.
Figure 2:
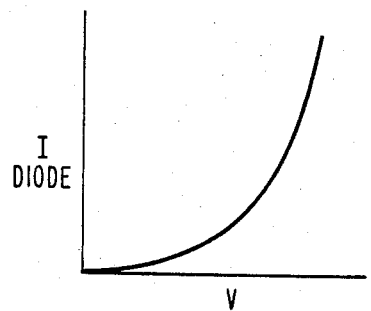
FIG. 2 is a diagram of an I-V transfer characteristic of a semiconductor diode used in an embodiment of the invention.
Figure 3:
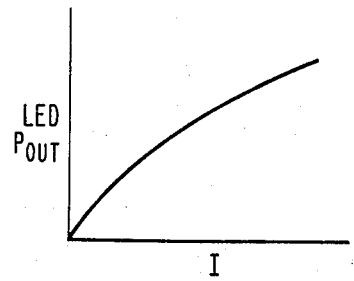
FIG. 3 is a transfer diagram of a power/current waveform for a light emitting diode used in an embodiment of the invention.

The predistortion equalizer 11, depicted generally in FIG. 1, makes use of the similarity of a semiconductor diode V-I characteristic (depicted in generally in FIG. 2) and the optical power/current characteristic (shown generally in FIG. 3) of a light emitting diode (not shown). Both the curves depicted in FIGS. 2 and 3 have more radical curvature at low current and less curvature (more linearity) at high current. The semiconductor diode characteristic, when used with an active buffer, creates a transfer characteristic curve opposite to that of the light emitting diode (LED). The diode buffer combination creates an active real time expander/compressor of the input signal waveform. By adjusting the operating point of the diode (curvature characteristic), and a series resistor (adding linearity to the characteristic), one can match the LED characteristic to cancel even order distortion.

The advantages of the foregoing is that one can easily and economically linearize a light emitting diode by adjusting two controls of a low cost and relatively simple circuit to accommodate transmission of multiple analog television channels. This enable more subscribers to use video services over the same optical fiber.

Referring to FIG. 1, there is illustrated a circuit diagram of an equalizer circuit in accordance with a preferred embodiment of the invention. An input signal is applied to an input terminal 12 which can be the central conductor of a coaxial cable. The outer covering of the coaxial cable can be coupled to a point of reference potential, such as ground. The input signal applied to the terminal 12 is coupled to the bases 13, 14 of an NPN transistor 16 and a PNP transistor 17, respectively. The collectors 18, 19 of the transistors 16, 17 are coupled via respective resistors 21, 22 to a +V voltage source and a −V voltage source, respectively. In similar fashion, the emitters 23, 24 of the transistors 16, 17 are coupled via resistors 26, 27, respectively, to voltage sources −V and +V, respectively.

The bases 13, 14 are coupled via a resistor 28 to a point of reference potential, such as ground. Collector capacitors 29, 31 couple the collectors 18 and 19 to a common output terminal 32.

The emitters 23 and 24 are coupled to capacitors 33, 34, respectively, to an emitter load resistance 36 (shown in dotted outline).

The emitter load resistance 36 includes a serially connected variable resistance 37 and a semiconductor diode 38. The cathode of the semiconductor diode 38 is coupled to a point of reference potential, such as ground. The anode of the semiconductor diode 38 is coupled through a variable resistance 39 to a point of positive potential +V.

Figure 1A:
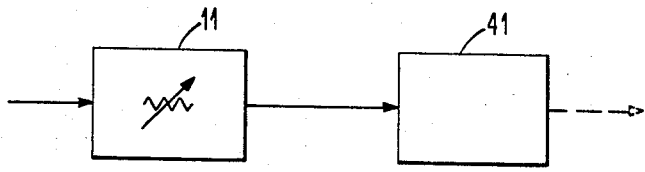
FIG. 1A is a block diagram of another embodiment of the invention.

The equalizer circuit 11 can be coupled to a driver card 41 (FIG. 1A), which card 41 includes a light emitting diode for providing light therefrom.

The semiconductor diode 38 is used as an active variable resistance in the emitter load of the buffer/amplifier 16, 17. The amount of direct current through the semiconductor diode 38 selects the operating point on the semiconductor diode characteristic curve shown in FIG. 2. The semiconductor diode 38 changes resistance about its operating point with an AC signal swing. The resistance 37 can be varied to wash out or linearize the curvature of the semiconductor diode 38 resistance characteristic. The semiconductor diode 38 and the resistor 37 series resistance controls the gain of the transistors 16, 17 with signal swing. For a positive going input signal, the semiconductor diode 38 conducts more current, has lower resistance, and therefore causes increased signal gain at the collectors of the transistors 16, 17. For a negative going signal, the semiconductor diode 38 resistance increases, reducing signal gain. As the collector waveform is inverted, the amplifier has expanded gain on the negative output swing and compressed gain with the positive output swing, thereby correcting a positive bending LED characteristic. A negative bending LED characteristic is corrected by reversing the diode and the polarity of the diode supply voltage. With careful adjustment of the resistance 37 and the current through the diode 38 by the adjustment of the resistance 39, an LED can be linearized with a great deal of accuracy.

The circuit can be used to electrically linearize any singularly curved low odd order distortion transfer characteristic of a device that has electrical input and some kind of output, whether it be light, mechanical motion, fluid flow, etc.

A new feature of this device is its economic and accurate real time expansion and compression of wideband radio frequency signals as a function of voltage swing, thus enabling cancellation of even order harmonic and intermodulation distortion of light emitting diodes.

What is claimed is:

1. An equalizing circuit for predistorting an input signal to be applied to a light emitting diode to compensate for second order distortion caused by said light emitting diode comprising
   an NPN transistor having a collector, a base, and an emitter;
   a PNP transistor having a collector, a base, and an emitter;
   means for coupling an input signal to said bases of said transistors;
   first impedance means for coupling said collector of said NPN transistor to a source of positive potential;
   second impedance means for coupling said collector of said PNP transistor to a source of negative potential;
   third impedance means for coupling said emitter of said NPN transistor to a source of negative potential;
   fourth impedance means for coupling said emitter of said PNP transistor to a source of positive potential;
   means for coupling said collectors to said light emitting diode; and
   emitter resistance means including
     a serially connected first variable resistance and semiconductor diode coupled as a dynamic emitter load resistance across said emitters and a point of reference potential, and
     a second variable resistance coupling one electrode of said semiconductor diode to a voltage source of such polarity as to cause current to flow through said semiconductor diode.

2. The circuit as recited in claim 1 wherein said second variable resistance can be varied to obtain a desired amount of nonlinearity about a current-voltage characteristic of said semiconductor diode, and said first variable resistance can be varied to add linearity to this characteristic such that the combined effect matches and thus cancels the nonlinearity of a current-power characteristic of said light emitting diode.

3. An equalizing circuit for predistorting an input signal to be applied to a device to compensate for distortion caused by said device comprising
   an NPN transistor having a collector, a base, and an emitter;
   a PNP transistor having a collector, a base, and an emitter;
   means for coupling an input signal to said bases of said transistors;
   first impedance means for coupling said collector of said NPN transistor to a source of positive potential;

second impedance means for coupling said collector of said PNP transistor to a source of negative potential;

third impedance means for coupling said emitter of said NPN transistor to a source of negative potential;

fourth impedance means for coupling said emitter of said PNP transistor to a source of positive potential;

means for coupling said collectors to said device; and emitter resistance means including
 a serially connected first variable resistance and semiconductor diode coupled as a dynamic emitter load resistance across said emitters and a point of reference potential, and
 a second variable resistance coupling one electrode of said semiconductor diode to a voltage source of such polarity as to cause current to flow through said semiconductor diode.

4. The circuit as recited in claim 3 wherein said second variable resistance can be varied to obtain a desired amount of nonlinearity about a current/voltage characteristic of said semiconductor diode, and said first variable resistance can be varied to modify this nonlinearity to match and thus cancel the nonlinearity of a current/power characteristic of such device.

* * * * *